United States Patent [19]
Dryer et al.

[11] Patent Number: 5,777,488
[45] Date of Patent: Jul. 7, 1998

[54] INTEGRATED CIRCUIT I/O NODE USEABLE FOR CONFIGURATION INPUT AT RESET AND NORMAL OUTPUT AT OTHER TIMES

[75] Inventors: Stephen F. Dryer, Los Altos; Rong-Hui Hu, Fremont, both of Calif.

[73] Assignee: Seeq Technology, Inc., Fremont, Calif.

[21] Appl. No.: 634,879

[22] Filed: Apr. 19, 1996

[51] Int. Cl.$^6$ .................................................. H03K 19/173
[52] U.S. Cl. .......................................... 326/38; 326/37
[58] Field of Search ............................................ 326/37, 38

[56] References Cited

U.S. PATENT DOCUMENTS

| | | | |
|---|---|---|---|
| 5,051,622 | 9/1991 | Pleva | 326/38 |
| 5,175,859 | 12/1992 | Miller et al. | 326/38 |
| 5,216,714 | 6/1993 | Speiser | 380/9 |
| 5,323,463 | 6/1994 | Speiser | 380/9 |
| 5,594,362 | 1/1997 | Owen | 326/38 |
| 5,608,341 | 3/1997 | Andersson | 326/38 |

*Primary Examiner*—Edward P. Westin
*Assistant Examiner*—Richard Roseen
*Attorney, Agent, or Firm*—D'Alessandro & Ritchie

[57] ABSTRACT

The invention provides a method and system in which a single pin coupled to an integrated circuit (IC) chip is used to enter configuration information at a power-up time or a reset time (collectively referred to herein as a "reset time" or "reset interval"), and is also used to display output information during normal operation. The pin is coupled to a memory device, so as to store configuration information received during the reset interval. The pin is also coupled to an output driver controlled by a gate which combines output data with a signal indicating reset time, so as to put the output driver into a high impedance state during reset time when the input configuration data is being stored into the device and to drive the pin with the output value during non-reset times. Thus, a user of the IC may cause the memory to receive configuration information from the pin at power-up or during another reset time, while having the pin output normal data at times other than the reset interval.

4 Claims, 4 Drawing Sheets

INTEGRATED CIRCUIT I/O NODE USEABLE FOR CONFIGURATION INPUT AT RESET AND NORMAL OUTPUT AT OTHER TIMES

BACKGROUND OF THE INVENTION

1. Field of the Invention

This invention relates to input/output (I/O) nodes or "pins" for integrated circuit devices. More particularly, it relates to a circuit which allows a pin to be used for configuration input information transfer to the device as well as normal outputs from the device, thus reducing the pin count of the device.

2. Description of Related Art

In circuits which are integrated onto a semiconductor chip, the number of connectors to off-chip circuits, called "pins" is often limited. The limit may be due to the size of the chip, due to added expense of packaging the chip so as to have an increased number of pins, or due to a requirement for compatibility with a previous product. In each of these cases, it is desirable to provide the same functions using fewer pins, or to provide more functions using the same number of pins.

Many semiconductor circuits have a number of pins which are used for input of configuration information. Configuration information is used to set the circuit to an initial state, to program the circuit for operation using a set of configuration parameters, or for other purposes. Typically, configuration information is input only once each time the circuit is powered-up or otherwise globally reset. It is also typical for the configuration information to be input at the time of power-up, before the normal operation of the circuit commences. It would be advantageous to limit the number of pins used for input of configuration information.

The invention provides a technique by which pins used for input of configuration information may also be used as normal output pins, i.e., for output of information which is output during normal operation of the circuit.

SUMMARY OF THE INVENTION

The invention provides a method and system in which a single pin coupled to an integrated circuit (IC) chip is used to enter configuration input information at a power-up time or a reset time (collectively referred to herein as a "reset time" or "reset interval"), and is also used to display output information during normal operation. The pin is coupled to a memory device, so as to store configuration information received during the reset interval. The pin is also coupled to an output driver controlled by a gate which combines output data with a signal indicating reset time, so as to put the output driver into a high impedance state during reset time when the input configuration data is being stored into the device and to drive the pin with the output value during non-reset times. Thus, a user of the IC may cause the memory to receive configuration input information from the pin at power-up or during another reset time, while having the pin output normal data at times other than the reset interval.

DESCRIPTION OF THE PREFERRED EMBODIMENT

Those of ordinary skill in the art will realize that the following description of the present invention is illustrative only and is not intended to be in any way limiting. Other embodiments of the invention will readily suggest themselves to such skilled persons from an examination of the within disclosure.

Basic Device and Method

Figure 1:
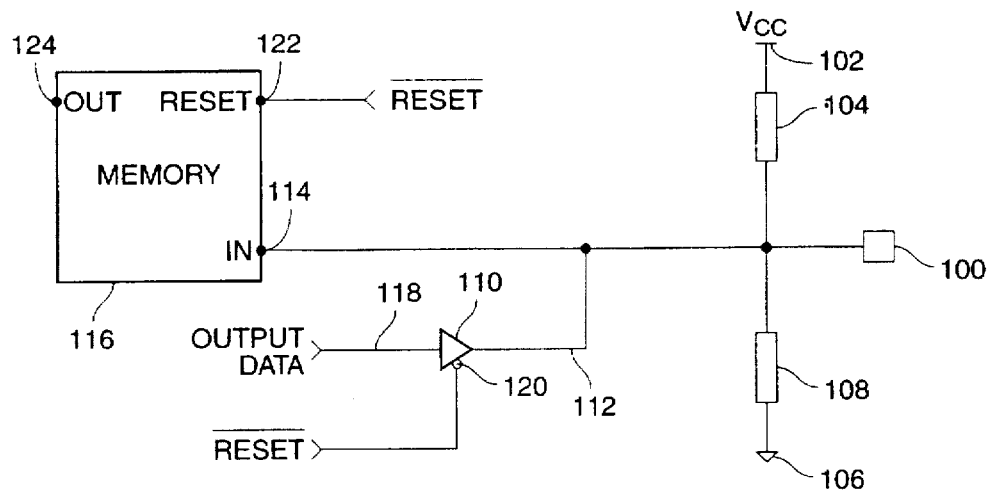
FIG. 1 is a circuit diagram of a circuit for providing a pin which may be used at reset time as a configuration-input pin and at other times as a normal-output pin.

FIG. 1 shows a circuit diagram of a circuit for providing a pin which may be used at reset time as a configuration-input pin and at other times as a normal-output pin. In the circuit, a pin 100 comprises a node for connection between circuitry within the chip and circuitry outside the chip. The pin 100 is coupled to a voltage Vcc 102 via a pullup means 104, and to ground 106 via a pull down means 108. A tri-state output driver 110 is capable of having an output on line 112 of 1 (high), 0 (low) or high impedance. When the output is 1, the output of pin 100 is 1. When the output is 0, the output of pin 100 is 0. When the output is high impedance, the memory device 116 is supplied with the RESET-bar signal at its reset input 122 and is therefore available for programming with a signal supplied on the "IN" node 114 of memory device 116. Thus, during the reset interval, a signal applied to pin 100 will be delivered to the "IN" node 114 of memory device 116 and stored into memory.

Figure 2:
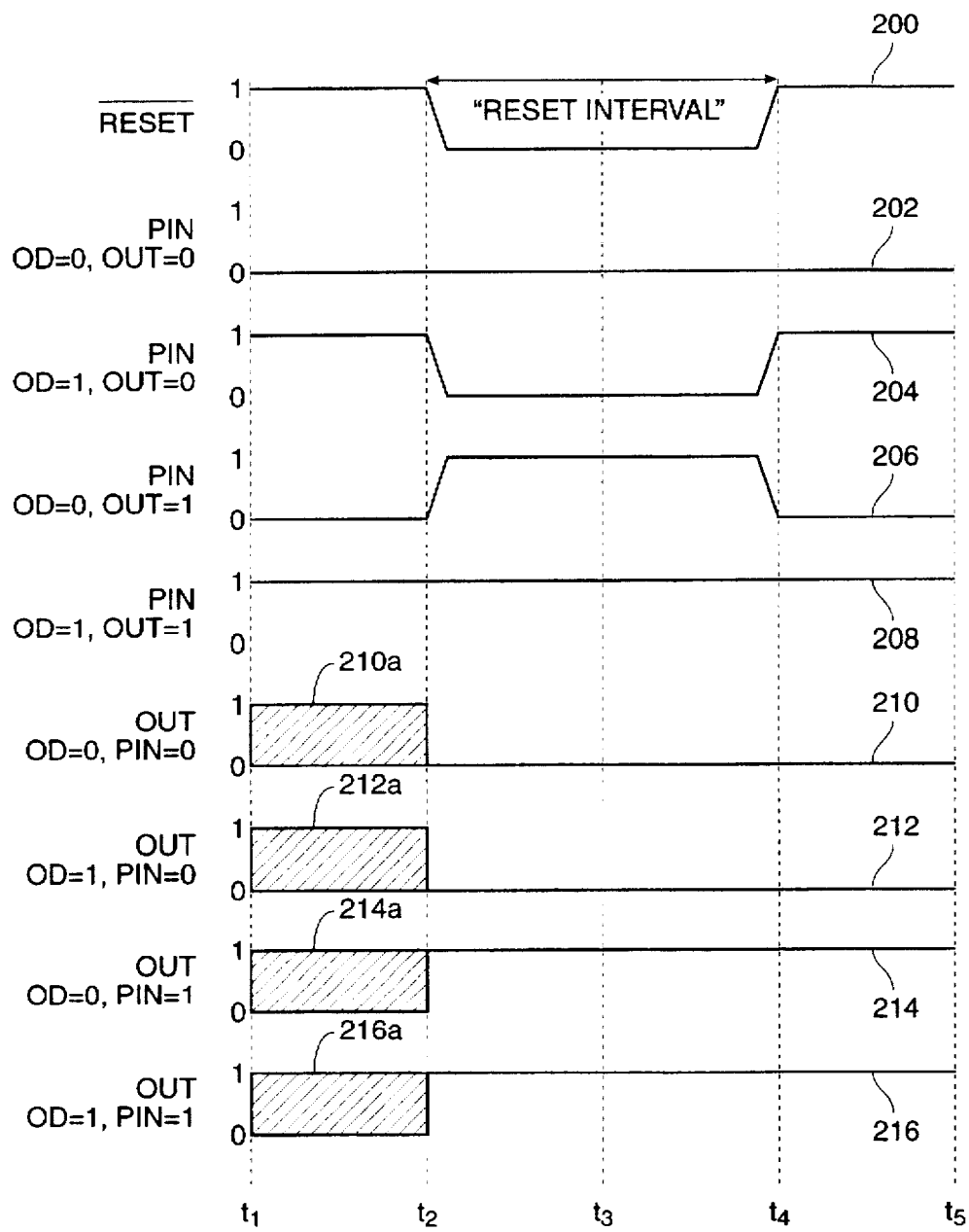
FIG. 2 is a timing diagram showing the operation of the circuit of FIG. 1.

A RESET signal, denoted RESET-bar or RESET with a line over it, is used to select the reset interval or reset time as shown in the timing diagram of FIG. 2. In the timing diagram of FIG. 2, there are five distinct times denoted $t_1$, $t_2$, $t_3$, $t_4$ and $t_5$. The period $t_{1-2}$ represents the time between $t_1$ and $t_2$. Other time periods will be represented by a similar convention. When RESET-bar is high, normal output data is available at pin 100. This "normal data" might be whatever data is designed to be output during normal operation of the chip and is designated "OUTPUT DATA" on input line 118 of tri-state output driver 110. When RESET-bar goes low ($t_{2-4}$) the low signal is applied to both (1) a reset input 120 of tri-state output driver 110 causing the output on line 112 to assume the high impedance state; and (2) reset input 122 of memory 116. During $t_{2-4}$ the OUTPUT DATA signal does not appear on line 112. Rather, the state of line 112 and memory input 114 is determined by an externally applied signal delivered to pin 100. Thus, when RESET-bar is applied to reset input 122 of memory 116, the signal on memory input 114 is stored and becomes the memory output signal on memory output 124—this is the configuration memory.

Thus, when RESET-bar is high, the normal chip OUTPUT DATA value from line 118 appears on the pin 100 and does not affect the stored value of the configuration input data on memory output 124. To program the configuration input data value and set the output of memory output 124, the user must pull the pin 100 high or low respectively with means 104 or 108 to the desired state during the reset interval, $t_{2-4}$.

It should be noted that the reset signal RESET-bar, referred to herein may be generated on-chip, or may be externally supplied. It may be due to a power-up condition, or other condition. For example, the chip could generate the signal internally in response to a power-up condition or the signal could be provided externally as by a reset button on a computer.

In FIG. 2, the RESET-bar signal is shown as trace 200 at the top of the diagram. Below trace 200 are traces 202, 204, 206 and 208 which show the signal on pin 100 (denoted "PIN") in response to various conditions of OUTPUT DATA signal on line 118 and memory output 124. Thus, trace 202 is based upon an OUTPUT DATA level of 0 and a memory output level of 0, trace 204 is based upon an OUTPUT DATA level of 1 and a memory output level of 0, trace 206 is based upon an OUTPUT DATA level of 0 and a memory output level of 1, and trace 208 is based upon an OUTPUT DATA level of 1 and a memory output level of 1.

Below traces 202–208 are traces 210, 212, 214 and 216 which show the signal on memory output 124 in response to various conditions of OUTPUT DATA and the input on pin 100. Thus, trace 210 is based upon an OUTPUT DATA level of 0 and a pin level of 0, trace 212 is based upon an OUTPUT DATA level of 1 and a pin level of 0, trace 214 is based upon an OUTPUT DATA level of 0 and a pin level of 1, and trace 216 is based upon an OUTPUT DATA level of 1 and a pin level of 1. The cross-hatched region 210a, 212a, 214a and 216a of each of these traces denotes a period (during $t_{1-2}$) during which the memory output 124 state is unknown.

Referring to FIG. 1, pullup means 104 is provided to pull the pin 100 up to Vcc 102 during the reset interval. This permits the storage of a logic "1" in the memory. Similarly, pulldown means 108 is provided to pull the pin 100 down to ground 106 during the reset interval. This alternatively permits the storage of a logic "0" in the memory. The pullup and pulldown means are "weak" enough that they do not interfere with output driver 110 during normal operation during non-reset interval times. Thus, a short would not work as it would short during normal operation as well as during the reset interval. Therefore, resistances and switches are appropriate as would be apparent to those of ordinary skill in the art.

Those of skill in the art will also readily appreciate that there are a great number of ways to construct pullup means 104 and pulldown means 108. A number of examples of possible mechanisms are discussed below—these are in no way intended to be an exhaustive list of such mechanisms.

Figure 3:
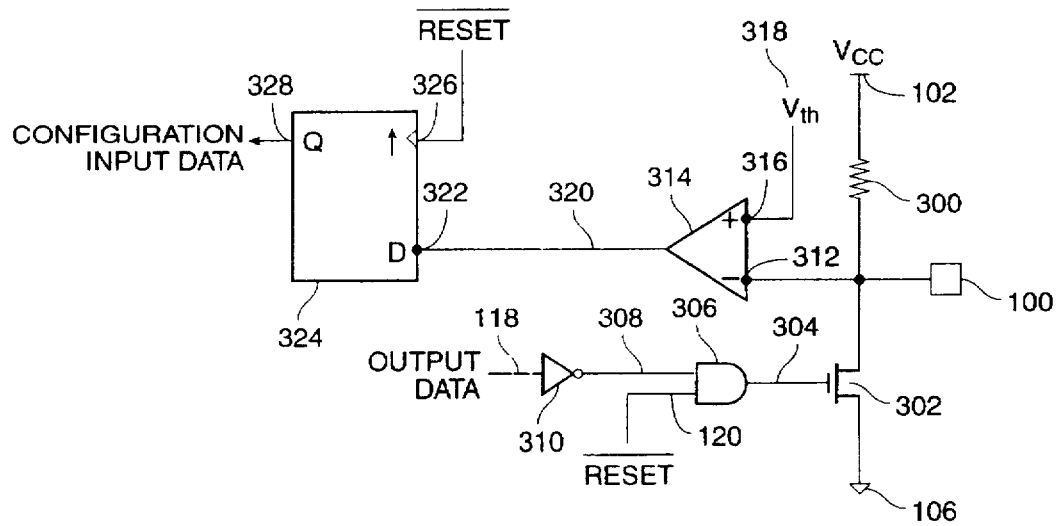
FIG. 3 is a circuit diagram of one presently preferred circuit for providing a pin which may be used at reset time as a configuration-input pin and at other times as a normal-output pin.

A presently preferred embodiment of the present invention is shown schematically in FIG. 3. In the circuit, a pin 100 comprises a node for connection between circuitry within the chip and circuitry outside the chip. The pin 100 is coupled to a voltage Vcc 102 via a pullup resistor 300, and to ground 106 via a driver transistor 302.

An OUTPUT DATA signal on line 118 is coupled through an inverter 310 to a first input 308 of AND gate 306. OUTPUT DATA signal on line 118 is a digital signal which represents an output data bit to be presented at the pin 100 during normal output ($t_{1-2}$ and $t_{4-5}$). A second input 120 for the AND gate 306 is coupled to the RESET-bar signal, which, as discussed above, is a digital signal which represents whether the chip is presently undergoing a reset operation. The controlling gate of driver transistor 302 is coupled to the output 304 of AND gate 306.

While the chip is undergoing a reset operation, the RESET-bar signal on line 120 will be logic "0", and the output 304 of the AND gate 306 will therefore also be logic "0". The output 304 of the AND gate 306 will cause the driver transistor 302 (here shown as an N-type transistor) to turn off, so that the voltage at the pin 100 will not be controlled by the OUTPUT DATA signal on line 118.

While the chip is in normal operation, i.e., not undergoing a power-on reset operation ($t_{1-2}$ and $t_{4-5}$), the RESET-bar signal will be logic "1", and the output 304 of the AND gate 306 will therefore be opposite to the OUTPUT DATA signal 306 on line 118. The output 304 of the AND gate 306 will therefore cause the driver transistor 302 to turn on when the OUTPUT DATA signal on line 118 is logic "1", coupling the pin 100 to ground 106 and causing the output at the pin 100 to be logic "0".

Alternatively, the output 304 of the AND gate 306 will cause the driver transistor 302 to turn off when the OUTPUT DATA signal on line 118 is logic "0". Because the pin 100 is coupled to the voltage Vcc 102 via the pullup resistor 300, the output at the pin 100 will be logic "1".

The pin 100 is also coupled to a negative input 312 of a comparator 314. A positive input 316 for the comparator 314 is coupled to a threshold voltage Vth 318. An output 320 of the comparator 314 is coupled to a D-input 322 of a rising edge triggered D-flipflop 324 (of course, any type of memory could be used here). A clock input 326 of the D-flipflop 324 is coupled to the RESET-bar signal.

The comparator 314 operates as follows to generate either a logic "1" or a logic "0" at D-input 322. Vth is set to about a volt below Vcc. When the signal at negative input 312 exceeds Vth, the comparator output 320 is "0". When the negative input 312 is less than Vth (i.e., when the drop through pullup resistor 300 is more than about 1 volt), the comparator output 320 is "1". The comparator is particularly useful in combination with pullup/pulldown schemes of FIGS. 4A and 4D which incorporate an LED.

As noted above, while the chip is undergoing a reset operation (i.e., during $t_{2-4}$), the RESET-bar signal will be logic "0", and the voltage at the pin 100 will not be controlled by the OUTPUT DATA signal on line 118. Instead, the voltage at the pin 100 will control the D-input 322 of the rising edge triggered D-flipflop 324. When the clock input 326 of the D-flipflop 324 transitions from "0" to "1", the D-flipflop 324 will latch the logic value at the pin 100, and that logic value will become available at a Q-output 328 of the D-flipflop 324 ("CONFIGURATION INPUT DATA").

In a preferred embodiment, information available at the Q-output 328 of the D-flipflop 324 is clocked out on rising edges of RESET-bar signal and the output of D-flipflop 324 stores the value of the input configuration information. This mechanism can be used to store more than a single bit of configuration information per pin. For example, in the situation where there are four bits of input configuration information, those four bits are serially clocked in and stored in a four-bit shift register. From the shift register, those four bits are then available for use by the on-chip circuit, and may be read out from the shift register in parallel or in serial. Similarly, there is no requirement that a D-flipflop be used—any conventional 1 or more bit memory device could also be used as would be apparent to one of ordinary skill in the art.

In FIG. 3, circuits for configuring the pin 100 during power-on reset operate by controlling the voltage at the pin 100 when the voltage at the pin 100 is not being controlled by the driving transistor 302.

FIGS. 4A–4E show circuit diagrams of circuits for configuring a pin for logic "0" or for logic "1" on configuration-input.

Figure 4A:
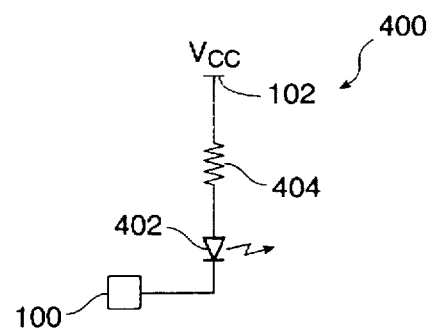
FIGS. 4A, 4B, 4C, 4D, 4E and 5 show circuit diagrams of circuits for storing input configuration data received on pin 100 during a reset interval as either logic "0" or logic "1".

In a first circuit 400 as shown in FIG. 4A for configuring a pin for logic "0" on configuration-input, the pin 100 is coupled to the voltage Vcc 102 via a light-emitting diode 402 coupled in series with a pullup resistor 404. When the pin 100 is used for normal input, the diode 402 can be used to emit light when a logic "1" is asserted on output 320 and to remain dark to when a logic "0" is asserted on output 320. This circuit may be used, for example, to replace pullup resistor 300 in FIG. 3. During a reset interval, this circuit will pull pin 100 toward a voltage greater than Vth causing comparator 314 (FIG. 3) to output a logic "0" at output 320 for input to memory input 322 of memory 324.

Figure 4B:
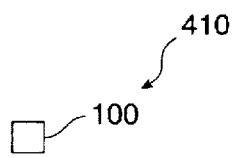

In a second circuit 410 as shown in FIG. 4B for configuring a pin for logic "0" on configuration-input, the pin 100 is left to float. Thus, during a reset interval, resistor 300 (FIG. 3) will pull pin 100 toward a voltage greater than Vth causing comparator 314 (FIG. 3) to output a logic "0" at output 320 for input to memory input 322 of memory 324.

Figure 4C:
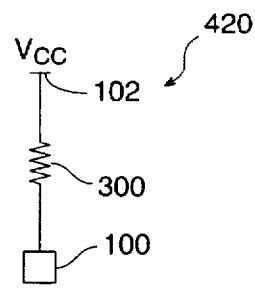

In a third circuit 420 as shown in FIG. 4C for configuring a pin for logic "0" on configuration-input, the pin 100 is tied to Vcc 102 with a pullup resistor 300 (as in FIG. 3). Thus, during a reset interval, this circuit will pull pin 100 toward a voltage greater than Vth causing comparator 314 (FIG. 3) to output a logic "0" at output 320 for input to memory input 322 of memory 324.

Figure 4D:
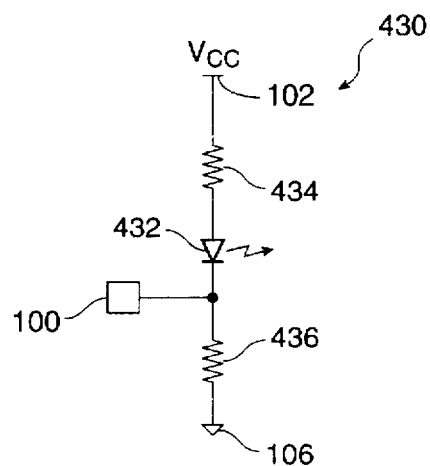

In a first circuit 430 as shown in FIG. 4D for configuring a pin for logic "1" on configuration-input, the pin 100 is coupled to the voltage Vcc 102 via a light-emitting diode 432 coupled in series with a pullup resistor 434, and to ground 106 via a pulldown resistor 436. There is a voltage drop of about 1.5 volts across the forward biased LED 432. Resistor 436 is selected so that the resistance of resistor 434 plus the voltage drop across diode 432 during a reset interval with no signal applied to pin 100 causes the voltage on pin 100 to be less than Vth (with reference to the circuit of FIG. 3). This causes comparator 314 (FIG. 3) to output a logic "1" at output 320 for input to memory input 322 of memory 324.

Figure 4E:
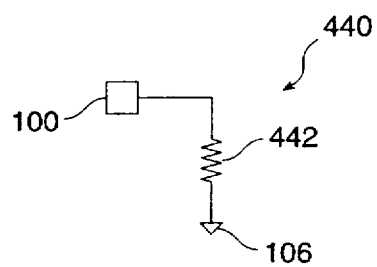

In a second circuit 440 as shown in FIG. 4E for configuring a pin for logic "1" on configuration-input, the pin 100 is coupled to ground 106 via a pulldown resistor 442. The value of resistor 442 is selected so that during a reset interval the voltage drop across resistor 300 (FIG. 3) is such that the voltage on pin 100 is less than Vth. This causes comparator 314 (FIG. 3) to output a logic "1" at output 320 for input to memory input 322 of memory 324.

Figure 5:
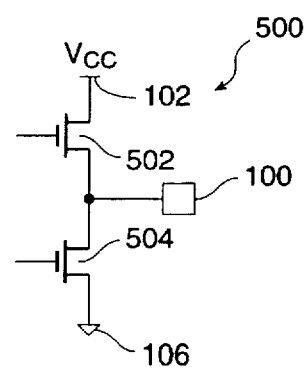

FIG. 5 shows a circuit diagram of an alternative circuit for providing a pin as a configuration-input pin and simultaneously as a normal-output pin. In the circuit 500 of FIG. 5, the pin 100 is coupled to the voltage Vcc 102 via a pullup transistor 502, and is simultaneously coupled to ground 106 via a pulldown transistor 504. The desired value for storage into the memory is selected by activating the appropriate gate of either transistor 502 ("0") or transistor 504 ("1").

Alternative Embodiments

Although illustrative presently preferred embodiments and applications of this invention are shown and described herein, many variations and modifications are possible which remain within the concept, scope, and spirit of the invention, and these variations would become clear to those of skill in the art after perusal of this application. The invention, therefore, is not to be limited except in the spirit of the appended claims.

What is claimed is:

1. Apparatus comprising:

an on-chip circuit integrated onto a semiconductor wafer, said circuit comprising a node disposed for coupling to an external pin, said node coupled to a driving circuit, said driving circuit including a transistor coupled between said node and a reference voltage and a logic gate coupled to a control input for said transistor, said logic gate being coupled to receive said reset signal and to receive a data signal, wherein said driving circuit is coupled to a source of a reset signal, said node is coupled to a memory, and said memory is coupled to said source of a reset signal.

2. Apparatus comprising:

an on-chip circuit integrated onto a semiconductor wafer, said circuit including a node disposed for coupling to an external pin, and a comparator coupled to said node and to a reference voltage, said node coupled to a driving circuit, said driving circuit coupled to a source of a reset signal, an output of said comparator coupled to a memory, and said memory coupled to said source of a reset signal.

3. A method of operating an on-chip circuit, said on-chip circuit being integrated onto a semiconductor wafer and comprising a node disposed for coupling to an external pin, said method comprising the steps of:

coupling said node to a memory during a reset interval of a reset signal;

coupling said node to a driving circuit during times other than during said reset interval; and causing said reset interval of said reset signal in response to said reset condition of said on-chip circuit;

wherein said step of coupling said node to a driving circuit comprises the steps of coupling said node to a reference voltage using a switch, and controlling said switch using a logic gate, said logic gate being coupled to receive said reset signal and to receive a data signal.

4. A method of operating an on-chip circuit, said on-chip circuit being integrated onto a semiconductor wafer and comprising a node disposed for coupling to an external pin, said method comprising the steps of:

coupling said node to a memory during a reset interval of a reset signal;

coupling said node to a driving circuit during times other than during said reset interval; and comparing an input signal from said node with a reference voltage before said step of coupling said node to a memory.

* * * * *

UNITED STATES PATENT AND TRADEMARK OFFICE
CERTIFICATE OF CORRECTION

PATENT NO. : 5,777,488
DATED : July 7, 1998
INVENTOR(S) : Stephen F. Dreyer, Rong-Hui Hu It is certified that error appears in the above-identified patent and that said Letters Patent is hereby corrected as shown below:

On title page, item [19] and item [75]

---In the "Inventors:" section, replace "Dryer" with --Dreyer--.

---On Col. 4, line 5, replace "1" with --0--.

---On Col. 4, line 10, replace "0" with --1--.

Signed and Sealed this

First Day of December, 1998

*Attest:*

BRUCE LEHMAN

*Attesting Officer*         *Commissioner of Patents and Trademarks*